US00RE35953E

United States Patent [19]

Nakano et al.

[11] E Patent Number: Re. 35,953

[45] Reissued Date of Patent: Nov. 10, 1998

[54] SEMICONDUCTOR DYNAMIC MEMORY DEVICE

[75] Inventors: Tomio Nakano, Kawasaki; Yoshiro Takemae, Yokohama, both of Japan

[73] Assignee: Fujitsu Limited, Kanagawa, Japan

[21] Appl. No.: 835,061

[22] Filed: Apr. 3, 1997

Related U.S. Patent Documents

Reissue of:

[64] Patent No.: 4,379,342
Issued: Apr. 5, 1983
Appl. No.: 249,718
Filed: Mar. 31, 1981

[30] Foreign Application Priority Data

Mar. 31, 1980 [JP] Japan ..... 55-41622

[51] Int. Cl.[6] ..... G11C 11/40

[52] U.S. Cl. ..... 365/182; 365/189.01; 365/230.01

[58] Field of Search ..... 365/189.01, 230.01, 365/182

[56] References Cited

U.S. PATENT DOCUMENTS 3,959,783 5/1976 Pressineau et al. ..... 365/189.01
4,110,840 8/1978 Abe et al. ..... 365/203

FOREIGN PATENT DOCUMENTS

A2-0037227 7/1981 European Pat. Off. .
52-92466 8/1977 Japan .

OTHER PUBLICATIONS

*4th European Solid State Circuits Conference,* Digest of Technical Papers, pp. 103–105, Sep. 18–21, 1978.
*IEEE International Solid–State Circuits Conference,* Digest of Technical Papers, pp. 156–157, Feb. 16, 1978.
*IEEE International Solid–State Circuits Conference,* vol. 23, Feb. 1980, pp. 66–67.
*The Semiconductor Memory Book,* 1978, pp. 130–138.
*IEEE International Solid–State Circuits Conference,* vol. 23, Feb. 15, 1980, pp. 234–235.
*IEEE Journal of Solid–State Circuits,* vol. SC–13, No. 5, Oct. 1978, pp. 607–610.
*Electronics,* vol. 49, No. 10, May 13, 1976, pp. 81–86.
*IEEE International Solid–State Circuits Conference,* vol. 21, Feb. 16, 1978, pp. 148–149.

*Primary Examiner*—Terrell W. Fears

[57] ABSTRACT

A dynamic semiconductor memory device comprising a plurality of memory blocks each including a sense amplifier array and a pair of memory cell groups, a row decoder for selecting a row line within the plurality of memory blocks, a column decoder which is common to the plurality of memory blocks and which selectively connects a sense amplifier in each of the memory blocks to a corresponding one of the pairs of bus lines. The device also includes row block decoders which selectively enable the sense amplifier array of one of the memory blocks according to block selecting address signals, and block bus line decoders which selectively connect the pair of bus lines of each of the memory blocks to a pair of data buses according to the block selecting address signals.

8 Claims, 4 Drawing Sheets

CAD
CDEC
CD
BDi
Dout
Din
AMP
B
LE
RBDi
Q23i
WLin
CLi
BLi1
BLKi
CLm
BLim
WDi
RAD
RDECi
Qi1b
Qimb
SAi1
SAim
BSi
BDi
BBDi
Qi1a
Qima
BLi1
QCi1
Ci1
BLim
QCim
Cim
Qib
Qia
WLi1
WL1n
WD1
RDEC1
WL11
BL11
BLK1
BL1m
QSmb
Q231
Q22
Q21
BD1
RBD1
DB
Q11b
QS1b
Q1mb
QSma
Q24
BBD1
Q11a
QS1a
SA11
Q1ma
SA1m
Q25
BS1
Q1b
Q1a
C11
QC11
C1m
QC1m

SEMICONDUCTOR DYNAMIC MEMORY DEVICE

Matter enclosed in heavy brackets [ ] appears in the original patent but forms no part of this reissue specification; matter printed in italics indicates the additions made by reissue.

BACKGROUND OF THE INVENTION (1) Field of the Invention

The present invention relates to a semiconductor memory device, and more particularly to a dynamic type RAM device which has a large memory capacity and low power consumption and which is used, for example, in an electronic computer.

(2) Description of the Prior Art

As illustrated in FIG. 1, a conventional MOS dynamic type RAM device comprises a row decoder RDEC, sense amplifier and column decoder group SAD which comprises column decoders CDEC1 through CDECm and sense amplifiers SA1 through SAm and which is located in the central portion of a memory chip, two memory cell groups MCG1 and MCG2 each comprising a plurality of memory cells and dummy cells and respectively located on the sides of the sense amplifier and column decoder group SAD, and an input/output amplifier AMP. The memory cell group MCG1 comprises the memory cells MCjk (j=1, . . . . , n/2; k=1, . . . . , m) arranged in m columns and n/2 rows and m dummy cells DC1k (k=1, . . . . , m) disposed in a row. The memory cell group MCG2 comprises the memory cells MCjk (j=n/2+1, . . . . , n; k=1, . . . . , m) arranged in m columns and n/2 rows and m dummy cells DC2k (k=1, . . . . , m) disposed in a row. From the row decoder RDEC, n row lines or word lines WL1 through WLn extend in the longitudinal direction of FIG. 1 and each of the row lines WL1 through WLn is connected to m memory cells in a corresponding row of the memory cell groups MCG1 and MCG2. From the row decoder RDEC, two dummy row lines or dummy word lines DWL1 and DWL2 extend parallel to the row lines WL1 through WLn. The dummy row lines DWL1 and DWL2 are respectively connected to m dummy cells DC1k and DC2k in corresponding rows of memory cell groups MCG1 and MCG2 respectively. From the sense amplifiers SA1 through SAm, m pairs of bit lines BL1 and BL1 through BLm and BLm extend in a transverse direction in FIG. 1 and each of the bit lines is connected to the n/2 memory cells and the dummy cell of a corresponding column. On both sides of the sense amplifier and column decoder group SAD, a pair of bus lines BS and BS are arranged and connected to the input/output amplifier AMP. Each of the memory cells MCjk comprises a capacitor Cjk (j=1, . . . . , n; k=1, . . . . , m) and a MOS transistor QCjk having a gate electrode connected to one of the row lines WL1 through WLn and, and a source or drain electrode connected to one of the bit lines BL1 and BL1 through BLm and BLm. Each of the dummy cells DC1k and DC2k comprising a capacitor CD1k or CD2k (k=1, . . . . , m), a MOS transistor QD1k or QD2k having a gate electrode is connected to the dummy row line DWL1 or DWL2 and a source or drain electrode connected to one of the bit lines BL1 and BL1 through BLm and BLm, and, a MOS transistor QR1k or QR2k connected in parallel with the capacitor CD1k or CD2k of the dummy cell DC1k or DC2k respectively. Each sense amplifiers SA1 through SAm comprises a pair of cross coupled MOS transistors Qa11 and Qa12 through Qam1 and Qam2. The device also includes row commonly connected to the drain electrode of a MOS transistor QE and a drain electrode connected to a pair of the bit lines BL1 and BL1 through BLm and BLm and to a pair of the bus lines BS and BS through one of MOS transistors Q11 and Q12 through Qm1 and Qm2. The transistor pairs Q11 and Q12 through Qm1 and Qm2 are operated by the column decoders CDEC1 through CDECm respectively.

When reading information from, for example, the memory cell MC11, the transistors QR11 through QR2m, has been previously turned on by a reset signal RST discharging electric charges of the capacitors CD11 through CD2m of the dummy cells DC11 through DC2m and, the row line WL1 is selected by the row decoder RDEC and the potential of the row line WL1 becomes high potential. At the same time, the dummy row line DWL2 is selected and the potential of the dummy row line DWL2 becomes a high potential. Therefore, the transistor QC11 of the memory cell MC11 and the transistor QD21 of the dummy cell DC21 are both turned on, and, the capacitor C11 and the capacitor CD21 are respectively connected to the bit lines BL1 and BL1 through the transistors QC11 and QD21. Since the bit lines BL1 and BL1 are both, as is well known, precharged, for example, to a high potential and the capacitance of each of the memory cells MCjk is larger than that of each of the dummy cells CD1k and CD2k, the potential of the bit line BL1 becomes lower than that of the bit line BL1 if the capacitor C11 is not charged, i.e. if the information "0" is stored in the memory cell MC11.

Next, the clock signal LE becomes a high potential turning transistor QE on and enabling sense amplifiers SA1 through SAm. Since the potential of the gate electrode of the transistor Qa12, i.e., the potential of the bit line BL1, is lower than that of the gate electrode of the transistor Qa11, i.e., that of the bit line BL1 as mentioned above, the transistor Qa12 is turned off and the transistor Qa11 is turned on. Thus, the potential of the bit line BL1 becomes much lower and the potential of the bit line BL1 becomes much higher.

In this condition, the transistors Q11 and Q12 are both turned on by the column decoder CDEC1 and the bit lines BL1 and BL1 are respectively connected to the bus lines BS and BS. Therefore, the potentials of the bit lines BL1 and BL1 are respectively transferred to the bus lines BS and BS. The input/output amplifier AMP detects the potential difference between the bus lines BS and BS and outputs a read out data. Dout corresponding to the potential difference.

It should be noted that the smaller the stray capacitance of each of the bit lines BL1 and BL1, compared with the capacitance of each of the capacitors C11 and CD21, the larger the potential difference between the bit lies BL1 and BL1 becomes, enabling the sense amplifier SA1 to more easily and surely detect the potential difference of the bit lines. However, due to the increase in the integration density of memory devices the size of each of the memory cells is decreased and the number of memory cells connected to a bit line is increased, so that the stray capacitance of each of the bit lines increase and the capacitance of the capacitor of each of the memory cells decrease. Therefore, when the memory capacity of the memory device is very large, the potential difference between the bit lines connected to the same sense amplifier is decreased to a value near the lower limit of the differential input voltage of the sense amplifier so that it is very difficult to detect the potential difference of the bit lines.

Generally, in a 16 Kbit memory device having a memory cell array of 128×128 bits, the number of sense amplifiers is 128, and the number of memory cells connected to a bit line is 64. Thus, one row of 128 memory cells disposed in a column and one of the dummy cells are connected to one sense amplifier. In the 64 Kbit memory device having memory cell array of 256×256 bits, the number of the sense amplifiers is 256, and the number of the memory cells connected to a bit line is 128. Therefore, in the 64 Kbit memory device, the number of memory cells connected to a bit line is twice that of the 16 Kbit memory device and the length of each of the bit lines becomes longer, so that the stray capacitance of each bit line becomes large and the potential difference between the bit lines decreases accordingly. As a result, it is necessary to use sense amplifiers having high sensitivity.

In order to solve the above-mentioned problem, an arrangement of circuit components on a semiconductor chip of a memory device as illustrated in FIG. 2 can be used. In the arrangement of FIG. 2, two memory blocks BLK1' and BLK2' each of which comprises a sense amplifier and column decoder group SAD and two memory cell groups MCG arranged on both sides of the sense amplifier and column decoder group SAD. The row decoder RDEC selects one row from one of the memory blocks BLK1' and BLK2'. The column decoders in the sense amplifier and column decoder groups SAD of both memory blocks operate at the same time and select corresponding columns of the memory blocks BLK1' and BLK2'. In the arrangement of FIG. 2, when the memory capacity is 64 Kbit, each of the memory cell groups MCG has 64 rows and 256 columns, thus the number of the memory cells connected to a bit line is 64. Therefore, the potential difference between the bit lines can be the same as that of the 16 Kbit memory device, and it is not necessary to use highly sensitive sense amplifiers. In the memory device having a still larger memory capacity, for example, 256 Kbit or 512 Kbit, the number of the memory blocks is increased, so that the number of the memory cells connected to a bit line does not increase greatly. In this case, the sense amplifiers and the column decoders are both located in the central portion of each memory block.

However, in the above-mentioned arrangement, the area on the semiconductor chip of the memory device occupied by the sense amplifier and column decoder groups is relatively large, thus reducing the area available for memory cells. Therefore, the semiconductor chip area is not used effectively. For example, in the 64 Kbit memory device having the arrangement of FIG. 2, the width of each of the memory cell groups MCG on the semiconductor chip is approximately 500 to 600 μm and the width of each of the sense amplifier and column decoder groups SAD is approximately 350 to 400 μm. Therefore, the width of each one of the memory blocks BLK1' and BLK2' is approximately 1350 to 1600 μm and each of the sense amplifier and column decoder groups SAD occupies approximately 25% of the area of each of the memory blocks BLK1' and BLK2'. Moreover, in semiconductor memory devices, other circuit components, such as the row decoder RDEC, are required and thus the area available for memory cells is further reduced.

Moreover, in the above-mentioned arrangement, the number of the column decoders driven by each of the column address buffer (not shown in the drawing) is large and, therefore, the load capacitance for each column address buffer is large, so that the operating speed of each of the column address buffer is decreased.

SUMMARY OF THE INVENTION

It is, therefore, the principal object of the present invention to provide an improved, novel dynamic type semiconductor RAM device having a large memory capacity and a greater portion of the chip area used for memory cells.

It is another object of the present invention to provide a dynamic type semiconductor RAM device having large memory capacity and low power consumption.

It is still another object of the present invention to provide a dynamic type semiconductor RAM device wherein the differential input voltage to each sense amplifier is not lowered, even when the memory capacity thereof is very large.

It is still another object of the present invention to provide a large capacity dynamic type RAM device having a high operating speed.

According to the present invention, there is provided a semiconductor memory device comprising a plurality of memory blocks, each including a sense amplifier array comprising a plurality of sense amplifiers and a pair of memory cell groups each comprising dynamic type memory cells; a row decoder means for selecting a row line within the plurality of memory blocks; a column decoder which is common to the plurality of memory blocks and which selectively connects a pair of input/output terminals of the sense amplifier in each of the memory blocks to a pair of bus lines corresponding to the memory block, by changing the potential of one of column lines connected between the column decoder and the plurality of memory blocks; a row block decoder which selectively enables the sense amplifier array of one of the plurality of memory blocks in response to block selecting address signals; and block bus line decoders which selectively connect the pair of bus lines of each of the memory blocks to a pair of data buses connected to an input/output amplifier in accordance with the block selecting address signals.

DESCRIPTION OF THE PREFERRED EMBODIMENTS

Figure 1:
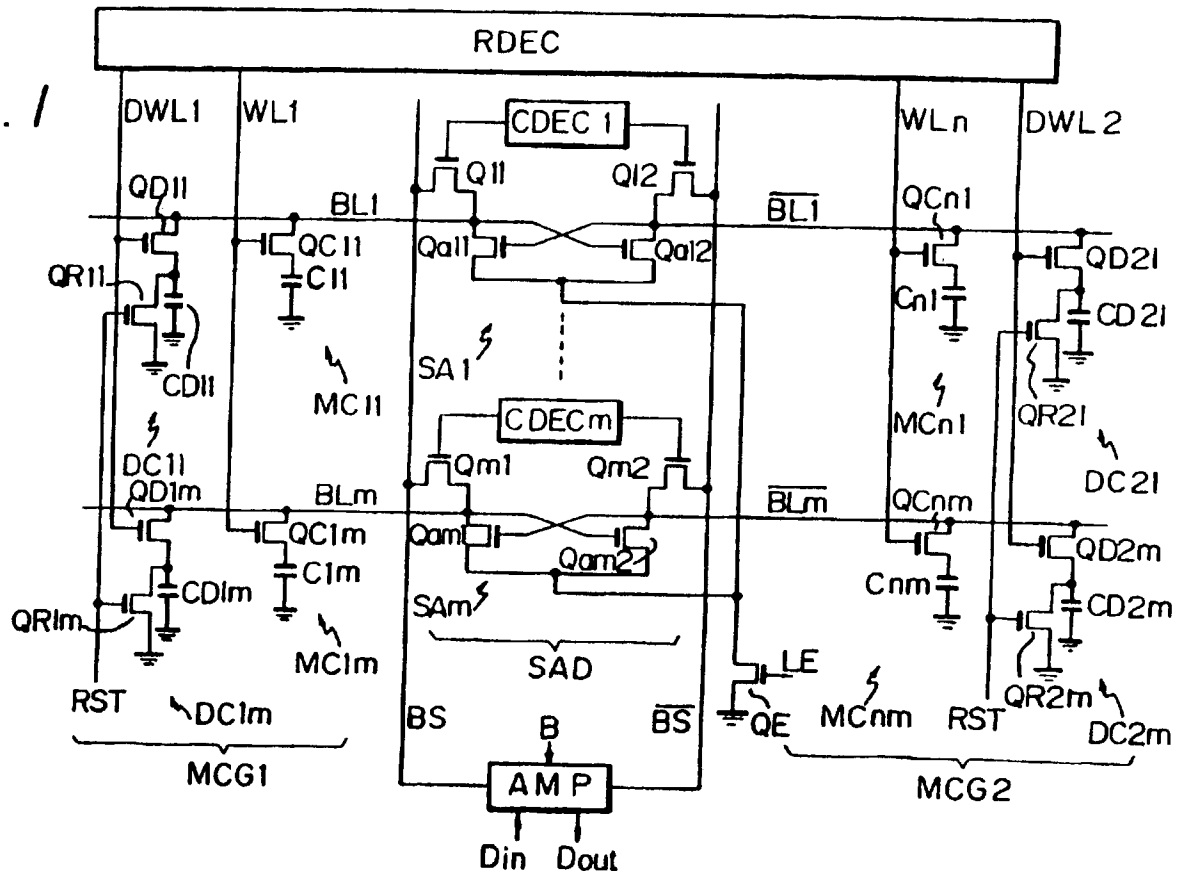
FIG. 1 is a schematic circuit diagram of a conventional MOS dynamic type RAM device.
Figure 2:
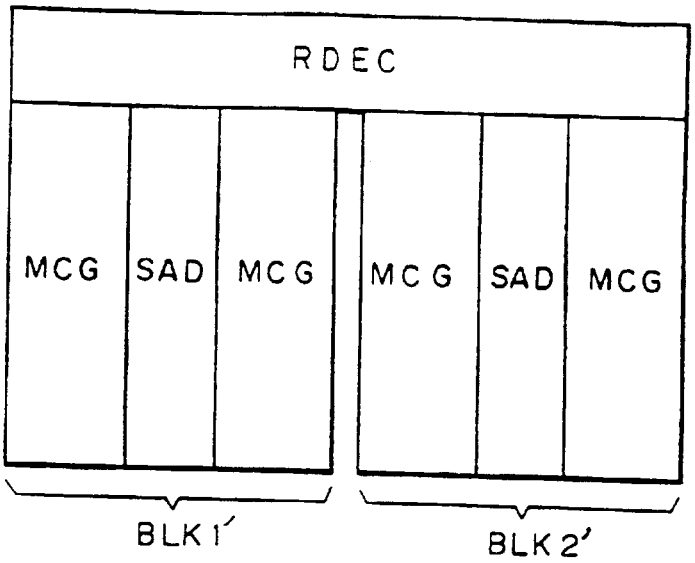
FIG. 2 is a plan view of an arrangement of circuit parts on a semiconductor chip of another conventional memory device; ;p
Figure 3:
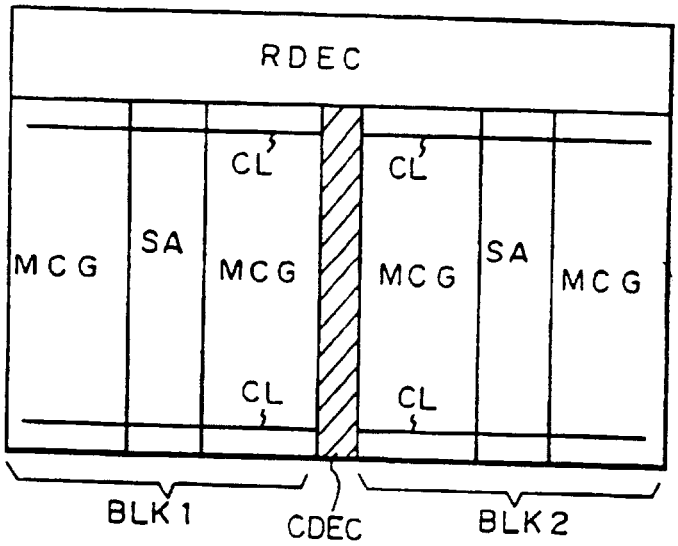
FIG. 3 is a plan view of an arrangement of circuit parts on a semiconductor chip of a memory device in accordance with an embodiment of the present invention.

As illustrated in FIG. 3, in an embodiment of the present invention, a common column decoder CDEC is arranged between the memory blocks BLK1 and BLK2. Each of the memory blocks BLK1 and BLK2 comprises a sense amplifier group SA and two memory cell groups MCG arranged on respective sides of the sense amplifier group SA. A plurality of column lines CL extend from respective sides of the common column decoder CDEC, in the transverse direction of FIG. 3, to both memory blocks BLK1 and BLK2. A row decoder RDEC located at the upper sides of the memory blocks BLK1 and BLK2 in FIG. 3 selects a row from the memory cell groups MCG of both memory blocks BLK1 and BLK2. It should be noted that in the embodiment of FIG. 3, in which the column decoder CDEC is provided between the memory blocks BLK1 and BLK2, the column decoder CDEC can be located not only in the central portion of the semiconductor chip between the memory blocks BLK1 and BLK2, but also at an outer side of either of the memory blocks BLK1 and BLK2.

Figure 4:
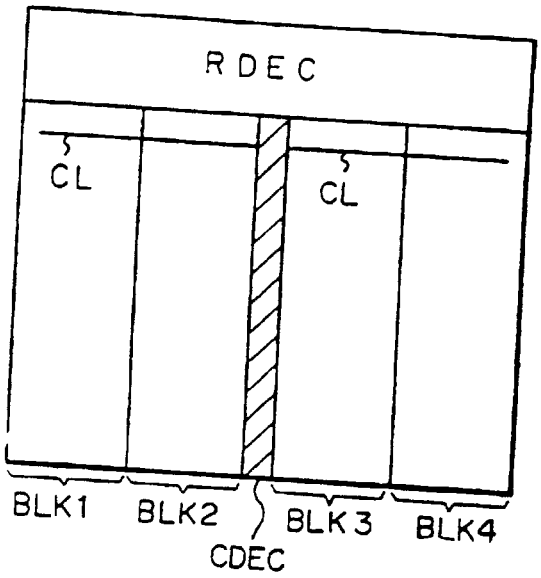
FIG. 4 is a plan view of an arrangement of circuit parts on a semiconductor chip of a memory device in accordance with another embodiment of the present invention.

FIG. 4 illustrates another embodiment of the present invention. In the embodiment of FIG. 4, four memory blocks BLK1 through BLK4 are employed along with a common column decoder CDEC which is located in the central portion between two memory blocks BLK1, BLK2 and two memory blocks BLK3, BLK4. Each of the memory blocks BLK1 through BLK4 comprises a sense amplifier group, and two memory cell groups are arranged on respective sides of the sense amplifier. A plurality of column lines CL extend from respective sides of the common column decoder CDEC to the memory blocks BLK1 and BLK2 and to the memory blocks BLK3 and BLK4. A row decoder RDEC is located along the upper sides of the memory blocks BLK1 through BLK4 and selects a row from the memory blocks BLK1 through BLK4. As mentioned above, it is possible to locate the column decoder CDEC at the outer sides of the memory blocks BLK1 and BLK4 or in an intermediate position between the memory blocks BLK1 and BLK2 or between the memory blocks BLK3 and BLK4.

Figure 5:
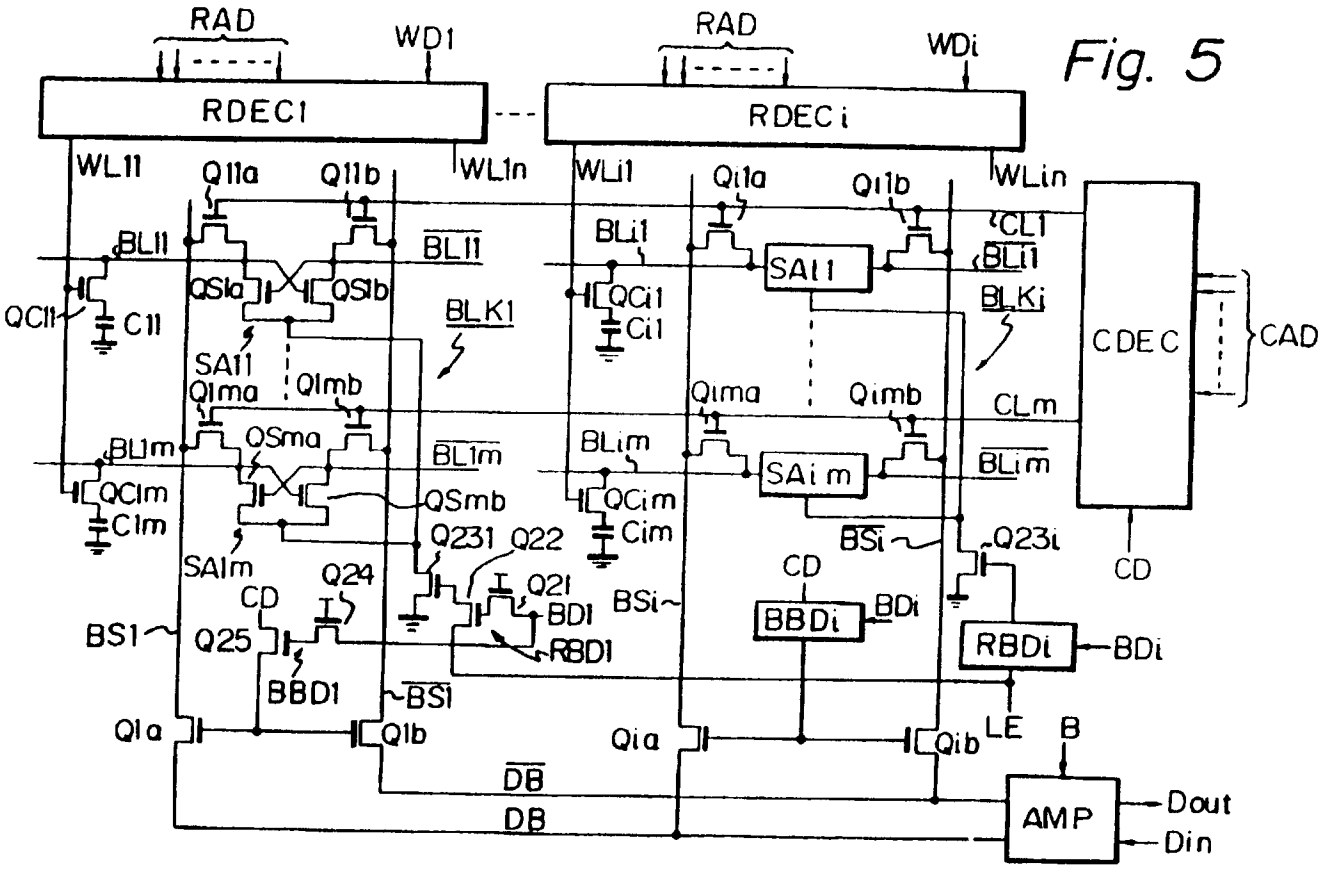
FIG. 5 is a schematic circuit diagram of a memory device according to the present invention.

FIG. 5 is a circuit diagram of a portion of a memory device according to another embodiment of the present invention. The memory device of FIG. 5 comprises i memory blocks BLK1 through BLKi, a common column decoder CDEC which is common to the memory blocks BLK1 through BLKi, and, i row decoders RDEC1 through RDECi each of which corresponds to one of the memory blocks BLK1 through BLKi. Each of the memory blocks BLK1 through BLKi comprises a sense amplifier group including m sense amplifiers SA11, . . . , SA1m through SAi1, . . . , SAim and two memory cell groups comprising a plurality of memory cells and dummy cells and located on respective sides of the sense amplifier group. Each of the memory cells or the dummy cells comprises a capacitor and a MOS transistor such as a capacitor C11 and a MOS transistor QC11. In FIG. 5, only a part of the memory cells of the memory cell groups is illustrated and the illustration of the other memory cells and the dummy cells is omitted. From the row decoders RDEC1 through RDECi, n row lines or word lines WL11, . . . , WL1n thrugh WLi1, . . . , WLin respectively extend, in the longitudinal direction of FIG. 5, to the corresponding memory blocks BLK1 through BLKi, and m memory cells are connected to each of the row lines WL11, . . . , WL1n through WLi1, . . . , WLin. From each of the sense amplifiers SA11, . . . , SA1m through SAi1, . . . , SAim, one of the bit line pairs BL11 and BL11, . . . , BL1m and BL1m through BLi1 and BLi1, . . . , BLim and BLim extends in the transverse direction of FIG. 5 and each of the bit lines is connected to n/2 memory cells and a dummy cell (not shown in the drawing) in a corresponding column. On respective sides of the sense amplifier groups, pairs of bus lines BS1 and BS1 through BSi and BSi are respectively disposed and are connected in common to a pair of data buses DB and DB through pairs of transistors Q1a and Q1b through Qia and Qib, respectively. The transistor pairs Q1a and Q1b through Qia and Qib are respectively turned on and off by block bus line decoders BBD1 through BBDi which are controlled by block selecting address signals BD1 through BDi respectively. The pairs of data buses DB and DB are connected to an input/output amplifier AMP which is controlled by a clock signal B. A pair of input/output terminal for each of the sense amplifiers, for example, SA11 through SA1m is connected to the pair of bus lines BS1 and BS1 through the transistor pairs Q11a and Q11b through Q1ma and Q1mb, respectively. Similarly, the input/output terminals of the remaining sense amplifiers are connected to corresponding bus line pairs. From the common column decoder CDEC, m column lines, CL1 through CLm, extend in the transversal direction of FIG. 5 and are respectively connected to transistor pairs Q11a and Q11b, . . . , Qi1a and Qi1b through Q1ma and Q1mb, . . . , Qima and Qimb of the corresponding columns. Each sense amplifier comprises a pair of cross coupled MOS transistors. For example, the sense amplifers SA11 through SA1m comprise pairs of cross coupled MOS transistor QS1a and QS1b through QSma and QSmb, respectively. The source electrodes of these cross coupled transistors, for example in SA11 through SA1m, are commonly connected to ground through the MOS transistor Q231 which is operated by row block decoders RBD1 of the same row. Each of the row block decoders RBD1 through RBDi comprises two MOS transistors. For example the row block decoders RBD1 comprise MOS transistors Q22 and Q21. Each of the block bus line decoders BBD1 through BBDi comprises two MOS transistors, such a Q24 and Q25 of the block bus line decoders BBD1.

In FIG. 5, each of the block selecting address signals BD1 through BDi corresponds to, for example, one or more upper bits of row address information and is a high potential only when a corresponding memory block is selected. For example, when the memory block BLK1 is selected, the block selecting address signal BD1 is a high potential and all the other block selecting address signals BD2 through BDi are low. Signals WD1 through WDi designate gated clock signals which are produced by gating a row address clock signal WD (not shown in the drawing) by using the block selecting address signals BD1 through BDi. Therefore, only one of the gated clock signals WD1 through WDi of the selected memory block is a high potential at a given time. Each of the row decoders RDEC1 through RDECi receives row address signals RAD and one of the gated clock signals WD1 through WDi. The potential of only one of the row lines WL11, . . . , WL1n through WLi1, . . . , WLin of the selected memory block having a high potential gated clock signal is a high potential. CD designates a column line clock signal, LE designates an enable clock signal for the sense amplifiers and B designates a clock signal for the input/output amplifier AMP.

The read operation for the memory device of FIG. 5 will now be described. For example, when the memory cell comprising the transistor QC11 and the capacitor C11 is selected, the gated clock signal WD1 and the row address signals RAD are applied to the row decoder RDEC1. The row decoder RDEC1 decodes the row address signals RAD and sets the potential of the row line WL11 high, so that the transistors QC11 through QC1m of the memory cells connected to the row line WL11 are turned on and the capacitors C11 through C1m are respectively connected to the bit lines BL11 through BL1m. At the same time as the potential change of the row line WL11 to high level, the potential of the dummy row line (not shown in the drawing) connected to the row decoder RDEC1 is changed to high level and the transistors of the dummy cells connected to the dummy row line are turned on.

Next, the block selecting address signal BD1 and the enable clock signal LE are both set to a high potential and the transistor Q22 is turned on through the transistor Q21, so that the transistor Q231 is turned on and the sense amplifiers SA11 through SA1m are activated. The potential difference between the bit lines BL11 and BL11 is detected and amplified by the sense amplifier SA11. At the time the potential difference between the bit lines BL11 and BL11 is amplified, the column decoder CDEC decodes the column address signals CAD under the control of the column line clock signal CD and sets the potential of the column line CL1 to high, so that the transistors Q11a and Q11b are both turned on. Since the column line clock signal CD and the block selecting address signals BD1 are both at a high potential, the transistor Q25 of the block bus line decoder BBD1 is turned on through the transistor Q24 and the transistors Q1a and Q1b are both turned on. Therefore, the bit lines BL1 and BL1 are respectively connected to the bus lines BS1 and BS1 through the transistors Q11a and Q11b, and connected to the data buses DB and DB through the transistors Q1a and Q1b. The input/output amplifier AMP which is operated by the clock signal B detects and amplifies the potential difference between the data buses DB and DB and outputs the read out signal Dout.

When the above-mentioned read operation occurs the non-selected memory blocks, for example, BLKi operate as follows. When the column line CL1 is selected and the potential thereof has changed from low to high potential, the potential of the block selecting address BDi applied to the row block decoder RBDi is low and the transistor Q23i is off, so that the sense amplifiers SAi1 through SAim are not enabled. Therefore, the potential of the bit lines BLi1 and BLi1 is maintained at a high level and the potential of the bus lines BSi and BSi is at a high level, so that the transistors Qi1a and Qi1b are off. This is because, even if the high level voltage is applied to the gate electrodes of the transistors Qi1a and Qi1b, the potential of the source, drain and gate electrodes of each of the transistors Qi1a and Qi1b are approximately the same and thus the transistors Qi1a and Qi1b do not turn on. In this condition, the potential of each of the row lines WLi1 through WLin is low, because the gated clock signal WDi applied to the row decoder RDECi is a low potential level. Therefore, none of the transistors of the memory cells of the non-selected memory block, for example, BLKi is turned on, so that the information stored in the memory cells of the non-selected memory blocks is not destroyed.

Since the block selecting address signal, for example, BDi of the non-selected memory block is a low potential level and the potential of the output signal of the block bus line decoder BBDi is low, the transistors Qia and Qib are both in a turned off condition. Therefore, the bus lines BSi and BSi of the non-selected memory block are not connected to the data buses DB and DB, and thus only the bus lines BS1 and BS1 of the selected memory block are connected to the data buses DB and DB whose potential difference is detected by the input/output amplifier AMP at the time designated by the clock signal B.

Figure 6:
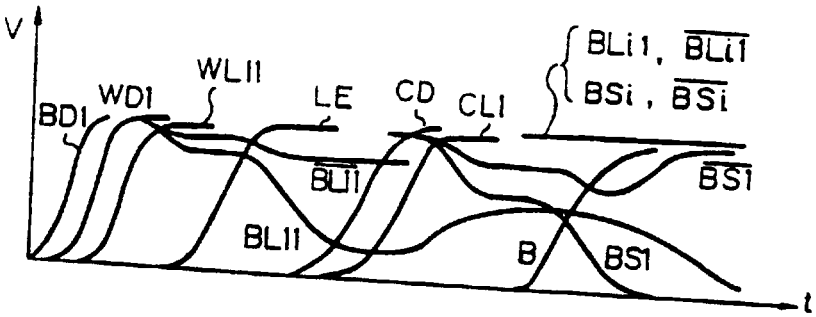
FIG. 6 is a waveform diagram of signals of the circuit of the memory device of FIG. 5.

FIG. 6 illustrates signal waveforms of the circuit of FIG. 5. As illustrated in FIG. 6, after the potential of the row line, for example, WL11 of the row decoder RDEC1 has changed from a low to a high potential due to the potential change of the block selecting address signal BD1 and the gated clock signal WD1 from low to high, the potential difference occurs between the bit lines BL11 and BL11 in accordance with the information stored in the memory cell comprising the capacitor C11. If the capacitor C11 is charged, i.e., information "1" is stored, the potential of the bit line BL11 is slightly higher than that of the bit line BL11, and if the capacitor C11 is not charged, i.e., information "0" is stored, the potential of the bit line BL11 is slightly lower than that of the bit line BL11. FIG. 6 illustrates the case where the capacitor C11 is not charged. Then, the enable clock signal LE changes from low to a high potential and the potential difference between the bit lines BL11 and BL11 is amplified by the sense amplifier SA11. Since the potential of the bit line BL11 is slightly lower than that of the bit line BL11, the transistor QS1a of the sense amplifier SA11 is turned on and the transistor QS1b of the sense amplifier SA11 is turned off, so that the potential of the bit line BL11 falls toward the ground potential.

Then, after the column line clock signal CD changes from a low to a high potential, the potential of the column line, for example, CL1 connected to the column decoder CDEC changes from a low to a high potential and the bit lines BL11 and BL11 are connected to the bus lines BS1 and BS1, respectively. Therefore, the potential of the bus line BS1 falls to the same potential as that of the bit line BL11. On the other hand, the potential of the bus line BS1 falls and the potential of the bit line BL11 rises, so that the potentials of the bus line BS1 and the bit line BL11 reach approximately the same level.

In this condition, the clock signal B applied to the input/output amplifier AMP changes from a low to a high potential and the input/output amplifier AMP is enabled, thereby the potential of the bus line BS1 falling to the lower potential level and the potential of the bus line BS1 rising to the higher potential level after a slight drop. The waveforms of the potentials of the data buses DB and DB are approximately the same as those of the potentials of the bus lines BS1 and BS1, respectively, and therefore the illustration thereof is omitted. The input/output amplifier AMP outputs the read out signal Dout in accordance with the potential difference between the data buses DB and DB. In this case, the potential of the bit lines such as BLi1 and BLi1 of each of the non-selected memory blocks and the potential of the bus lines such as BSi and BSi of each of the non-selected memory blocks are both in a high level as illustrated in FIG. 6.

As mentioned above, in the memory device according to the present invention, since the column decoder CDEC is common to a plurality of memory blocks, the area of the semiconductor chip can be smaller than that of the conventional memory device comprising a sense amplifier and column decoder group for every memory block. Although the column lines CL1 through CLm are connected in common from the column decoder CDEC to each memory block, the information stored in the memory cells of the non-selected memory blocks is not destroyed. This is because only the sense amplifers of the selected memory block are enabled by the block selecting address signal, and the sense amplifiers and the row lines of the non-selected memory blocks are not enabled. Moreover, since the sense amplifiers of the non-selected memory blocks are not enabled, the power consumption of the memory device is decreased and the load of the enable clock signal LE is reduced.

Therefore, according to the present invention, it is possible to provide a MOS dynamic type RAM device having high integration density and low power consumption. Further it is easy to provide a RAM device having a memory capacity of 64 Kbit or more.

We claim:

1. A semiconductor memory device, operatively connected to receive address signals including block selecting address signals, comprising:

a plurality of memory blocks each including row lines, [data bus]*bit line* pairs, a pair of bus lines and a sense amplifier array comprising a plurality of sense amplifiers each having a pair of input/output terminals, and a pair of memory cell groups including dynamic type memory cells;

an input/output amplifier operatively connected to each of said pairs of bus lines;

row decoder means for selecting a corresponding one of said row lines of said plurality of memory blocks;

a column decoder [comprising] *connected to* column lines, each having a potential, and operatively connected in common to said plurality of memory blocks, said column decoder selectively connecting a corresponding pair of said input/output terminals of the plurality of sense amplifiers in [each of] said memory blocks to a corresponding one of said pairs of bus lines corresponding to the memory block in response to a change in the potential of a corresponding one of said column lines connected between said column decoder and said plurality of memory blocks;

row block decoders operatively connected to receive said block selecting address signals, to said sense amplifier array and to said plurality of memory blocks, said row block decoders selectively enabling said sense amplifier array of a corresponding one of said plurality of memory blocks in accordance with *the* block selecting address signals; and block bus line decoders operatively connected to receive said block selecting address signals, to corresponding ones of said pairs of bus lines, and to corresponding ones of [said] *a* plurality of [a] *said* sense [amplifiers] *amplifier arrays*, said block bus line decoders selectively connecting said corresponding [ones] *one* of said pairs of bus lines [of each] of said memory blocks to a [corresponding]pair of [said] data [bus pairs] *buses* connected to said input/output amplifier in accordance with said block selecting address signals.

2. A semiconductor memory device as set forth in claim 1, wherein said column decoder is disposed adjacent to one of said plurality of memory blocks.

3. A semiconductor memory device as set forth in claim 1, wherein said column decoder is disposed between respective ones of said plurality of memory blocks.

4. A semiconductor memory device as set forth in claim 1, wherein said column decoder is disposed in the center of said plurality of blocks.

5. A semiconductor memory device as set forth in claim 1, wherein said address signals further include row address signals, wherein said device is operatively connected to receive row address clock signals and gated clock signals, wherein said row lines have selected and non-selected states, and wherein said row decoder means comprises:

a plurality of row decoders, respectively, operatively connected to a corresponding one of [siad] *said* plurality of memory blocks, to [recieve] *receive* said row address signals and to receive a corresponding one of said gated clock signals, said gated clock signals responsive to a corresponding one of said row address clock signals and said block selecting address signals, and each of said row decoders selecting a corresponding one of said row lines in response to said gated clock signal.

6. A semiconductor memory device as set forth in claim 1, wherein said address signals further include row address signals, and wherein said block selecting address signals are responsive to predetermined ones of said row address signals.

7. A semiconductor memory device as set forth in claim 1, 2, 3, 4, 5 or 6, wherein said pair of memory cell groups is disposed on respective sides of said sense amplifier array.

8. A semiconductor memory device as set forth in claim 1, 2, 3, 4, 5 or 6, wherein each of said dynamic type memory cells comprises a MOS transistor and a capacitor.

* * * * *

UNITED STATES PATENT AND TRADEMARK OFFICE

CERTIFICATE OF CORRECTION

PATENT NO.: RE 35,953
DATED : November 10, 1998
INVENTOR(S): Tomio NAKANO et al

It is certified that error appears in the above-identified patent and that said Letters Patent is hereby corrected as shown below:

TITLE PAGE: [75] Inventors: Change "Yoshiro" to --Yoshihiro--;
*[73] Assignee: Change "Kanagawa" to --Kawasaki--.

Col. 4, line 41, delete ";p";
line 41, before "FIG.3" insert a paragraph return.

Col. 5, *line 45, change "thrugh" to --through--;
line 67, change "terminal" to --terminals--.

Col. 6, line 57, after "potential" insert --change--.

Signed and Sealed this

Ninth Day of March, 1999

*Attest:*

Q. TODD DICKINSON

*Attesting Officer*

*Acting Commissioner of Patents and Trademarks*